United States Patent
Hao

(10) Patent No.: US 11,630,732 B2
(45) Date of Patent: Apr. 18, 2023

(54) METHOD OF UPDATING FIRMWARE OF CHIP STABLY AND EFFECTIVELY, FIRMWARE UPDATING APPARATUS, AND COMPUTER READABLE STORAGE MEDIUM APPLYING METHOD

(71) Applicant: Fulian Precision Electronics (Tianjin) Co., LTD., Tianjin (CN)

(72) Inventor: Li-Yun Hao, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/706,808

(22) Filed: Mar. 29, 2022

(65) Prior Publication Data

US 2023/0063485 A1   Mar. 2, 2023

(30) Foreign Application Priority Data

Sep. 1, 2021   (CN) .......................... 202111020075.2

(51) Int. Cl.
| | |
|---|---|
| G06F 11/14 | (2006.01) |
| G01R 31/3185 | (2006.01) |
| G06F 8/654 | (2018.01) |
| G01R 31/317 | (2006.01) |

(52) U.S. Cl.
CPC .... G06F 11/1433 (2013.01); G01R 31/31709 (2013.01); G01R 31/318541 (2013.01); G01R 31/318544 (2013.01); G01R 31/318555 (2013.01); G06F 8/654 (2018.02)

(58) Field of Classification Search
None
See application file for complete search history.

(56) References Cited

U.S. PATENT DOCUMENTS

| | | | |
|---|---|---|---|
| 6,734,718 B1 * | 5/2004 | Pan .......................... | G11C 16/30 327/536 |
| 2002/0191476 A1 * | 12/2002 | Kojima ................. | G11C 7/1078 365/230.06 |
| 2003/0095429 A1 * | 5/2003 | Hirose .............. | H01L 27/10882 257/E21.656 |
| 2005/0223291 A1 * | 10/2005 | Zimmer .............. | G06F 11/1433 714/34 |
| 2008/0201661 A1 * | 8/2008 | Haynes ............... | G06F 11/3476 715/810 |
| 2018/0294808 A1 * | 10/2018 | Yang ..................... | H03K 17/223 |
| 2021/0074365 A1 * | 3/2021 | Dinh ..................... | G11C 7/1042 |

* cited by examiner

Primary Examiner — Steve N Nguyen
(74) Attorney, Agent, or Firm — ScienBiziP, P.C.

(57) ABSTRACT

A method of updating firmware in a chip in a stable and effective manner receives firmware outputted by a controller. The received firmware is burned into the chip. A voltage level of a controlling signal outputted by a controlling pin of the chip is latched to a certain level based on a latching signal at a first voltage level outputted by the controller. The storage medium is refreshed for making the burned firmware effective based on refresh instruction outputted by the controller. The latching signal at a second voltage level for unlatching the voltage level of the controlling signal is outputted by the controller if operations of the chip are stable. An updating operation of the chip by the method does not interrupt other operations being executed by the chip. A firmware updating apparatus and a computer readable storage medium applying the method are also disclosed.

20 Claims, 4 Drawing Sheets

METHOD OF UPDATING FIRMWARE OF CHIP STABLY AND EFFECTIVELY, FIRMWARE UPDATING APPARATUS, AND COMPUTER READABLE STORAGE MEDIUM APPLYING METHOD

FIELD

The subject matter herein generally relates to firmware updating.

BACKGROUND

A complex programmable logic device (CPLD) in an electronic device can be used for developing and designing digital circuits and integrated circuits. While updating firmware in the CPLD, an outputting signal of a controlling pin of the CPLD jitters, which causes unstable operation and errors in the outputted data.

Thus, there is room for improvement in the art.

BRIEF DESCRIPTION OF THE FIGURES

Implementations of the present disclosure will now be described, by way of example only, with reference to the attached figures.

DETAILED DESCRIPTION

Figure 1:
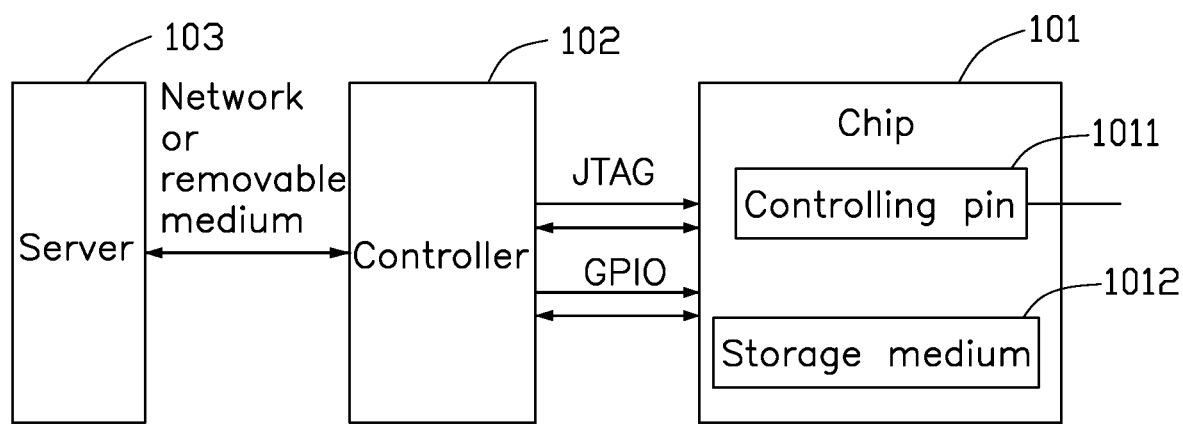
FIG. 1 is a diagram illustrating an embodiment of an application environment of a chip according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The terms "first" and "second" are for the purpose of describing only and should not be constructed to indicate or imply the relative importance. In the present disclosure, the term "some" means two or more, unless otherwise expressly stated.

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

FIG. 1 shows an application environment of a chip 101. The chip 101 can include a controlling pin 1011 for outputting a controlling signal. For example, the controlling pin 1011 can output an enable signal to an external circuit for activating the external circuit. The chip 101 further includes a storage medium 1012 for storing firmware. The firmware is used for updating the chip 101.

In one embodiment, the chip 101 can be a complex programmable logic device (CPLD), a field programmable gate array (FPGA), and the like.

A controller 102 is electrically connected with the chip 101. The controller 102 can be a central process unit (CPU), a baseboard management controller (BMC), and the like. The controller 102 can include a Joint Test Action Group (JTAG) interface for transmitting data with the chip 101 in a JTAG protocol. For example, the controller 102 can transmit the firmware to the chip 101 through a JTAG interface for updating the chip 101 or transmit a controlling instruction to the chip 101 for controlling the chip 101 to reflash or re-start, and the like.

The controller 102 also can include an Inter-Integrated circuit (I2C) interface for transmitting data to the chip 101 based on an I2C protocol. For example, the controller 102 transmits data of the firmware or the controlling instructions to the chip 101 through the I2C interface.

The controller 102 also can include a General-Purpose Input/Output (GPIO) interface. The controller 102 can transmit a latching signal to the chip 101 through the GPIO interface for latching or releasing the latching of a voltage level of a controlling signal outputted by the controlling pin 1011.

The controller 102 can connect with a server 103 through a network. For example, the controller 102 can connect with the server 103 through Ethernet, a wireless network, or by BLUETOOTH. The controller 102 also can connect with the server 103 through a removeable medium, such as a U-disk, a memory card, a USB data cable, and the like, for obtaining the firmware stored on the server 103.

When updating the firmware of the chip 101, the controller 102 downloads the firmware from the server 103 through the network or removable medium and transmits the downloaded firmware to the chip 101 through the JTAG interface or the I2C interface.

While updating the firmware of the chip 101, the controlling signal of the controlling pin 1011 can jitter, and the voltage level of the controlling signal may be unstable so as to affect the external circuit. Before the downloaded firmware effective, the controller 102 can transmit a latching signal at a first voltage level to the chip 101 through the GPIO interface for latching the voltage level of the controlling signal outputted by the controlling pin 1011. The latching signal at the first voltage level means that the voltage level of the controlling signal outputted by the controlling pin 1011 is locked without jitter and is not affected by an inputting signal received by the chip 101.

After making the firmware effective, the factors causing the voltage level of the controlling signal of the controlling pin 1011 to jitter are removed. When the firmware of the chip 101 operates normally, the controller can transmit the latching signal at a second voltage level to the chip 101 through the GPIO interface for releasing the latching of the voltage level of the controlling signal outputted by the controlling pin 1011. The latching signal being at the second voltage level means that the voltage level of the controlling signal outputted by the controlling pin 1011 is changeable according to the inputting signal received by the chip 101. The chip 101 thus works normally.

Figure 2:
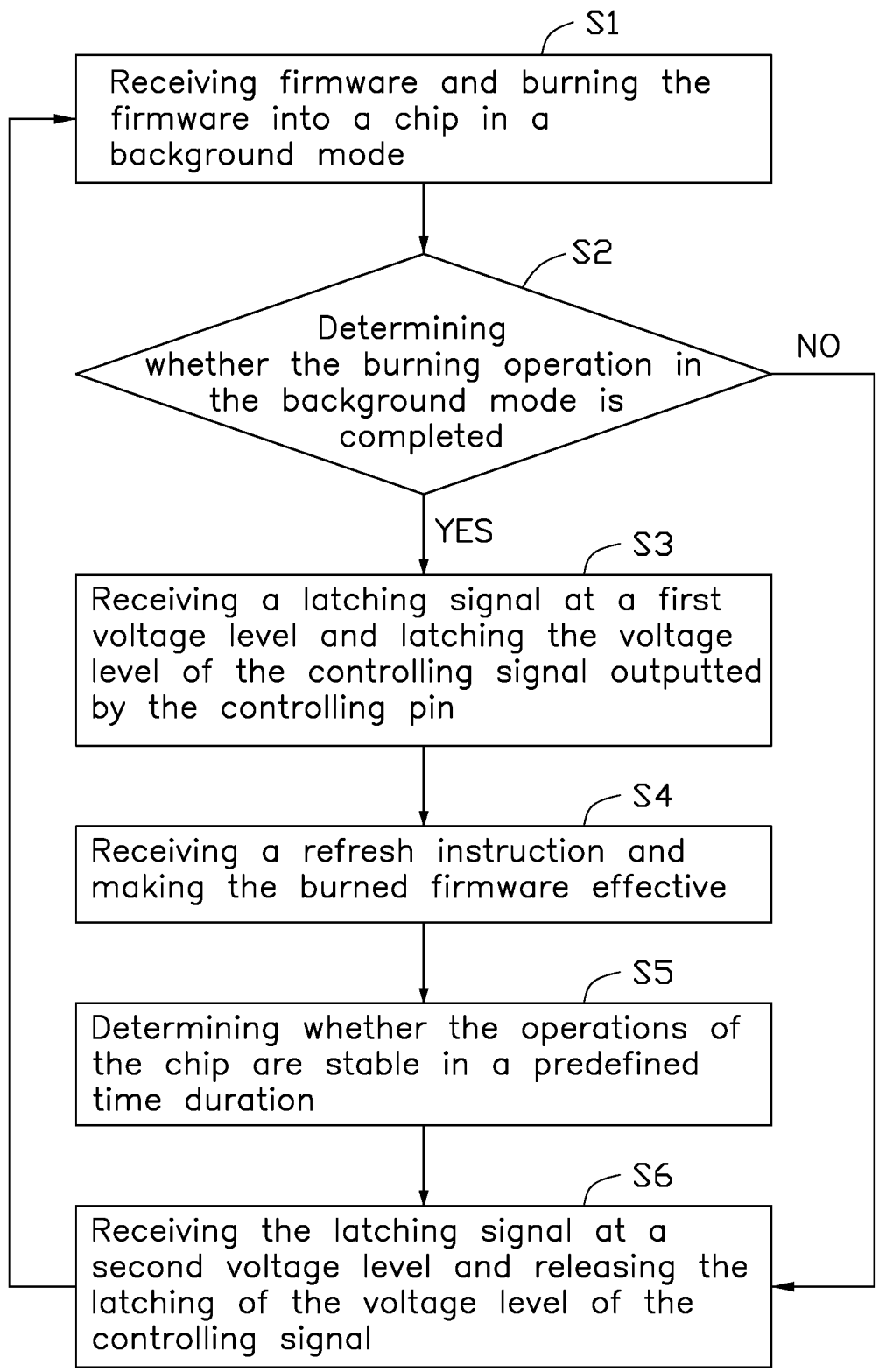
FIG. 2 is a flowchart illustrating an embodiment of a method of updating firmware of a chip according to the present disclosure.

FIG. 2 shows a flowchart of a method of updating the firmware of the chip 101. The method is used in the chip 101. The method includes the following steps. These steps may be re-ordered.

In block S1, a firmware is received and burned into a chip 101 in background mode.

In some embodiment, when updating the firmware of the chip 101, the controller 102 downloads the firmware from the server 103 through the network or removable medium. The firmware can be uploaded to the server 103 by a firmware manufacture. The controller 102 transmits the downloaded firmware to the chip 101 through the JTAG interface or the I2C interface. The chip 101 receives the downloaded firmware and burns the downloaded firmware into the storage medium 1012 in background mode.

In one embodiment, the background mode is a mode for parallel execution of a new operation without interrupting other operations. In background mode, the execution of operations and the burning operation are executed in parallel, and a work efficiency of the chip 101 is improved.

In block S2, determining whether the burning operation in background mode is completed.

In one embodiment, the burning operation is determined by the chip 101. While the burning operation is being executed, the procedure goes to block S6. When the burning operation is completed, the procedure goes to block S3.

In one embodiment, before the end of the burning operation, the chip 101 receives the latching signal at the second voltage level and the voltage level of the controlling pin 1011 is then changeable according to the inputting signal received by the chip 101.

In block S3, a latching signal at a first voltage level is received and a controlling signal outputted by the controlling pin 1011 is latched.

In one embodiment, the controller 102 transmits the latching signal to the chip 101 through the GPIO interface. The latching signal in different voltage levels can latch or release the latching the voltage level of the controlling signal of the chip 101.

When the firmware burning in background mode is completed, the controller 102 can determine the voltage level of the controlling signal outputted by the controlling pin 1011 through a boundary scan, and transmit the latching signal at the first voltage level (such as a high voltage level) to the chip 101. The chip 101 latches the voltage level of the controlling signal based on the received latching signal at the first voltage level.

In one embodiment, while updating the firmware of the chip 101, the controlling signal of the controlling pin 1011 can jitter, and the voltage level of the controlling signal can be unstable and affect the external circuit. When the chip 101 receives the latching signal at the first voltage level through the GPIO interface, the voltage level of the controlling signal outputted by the controlling pin 1011 is locked without jitter. Thus, the controlling signal can be stable for ensuring normal working of the chip 101.

In block S4, a refresh instruction is received for making the burned firmware effective.

In one embodiment, when the burning operation is completed, and the voltage level of the controlling signal is latched, the controller 102 transmits the refresh instruction to the chip 101 through the JTAG interface or the I2C interface. The chip 101 refreshes the storage medium 1012 for making the firmware effective based on the refresh instruction.

When refreshing the storage medium 1012, the chip 101 can execute the refresh operation in parallel with other operations without being powered off or re-started. A work efficiency of the chip 101 is improved.

In block S5, determining whether the operations of the chip 101 are stable in the predefined time duration.

In one embodiment, after the burned firmware to be effective, the operations of the chip 101 can be unstable, the controller 102 can output the latching signal at the first voltage level in the predefined time duration for preventing jitter of the controlling signal. In the predefined time duration, the operations of the chip 101 are determined by the chip 101. When the operations of the chip 101 are stable, the procedure goes to block S6. When the operations of the chip 101 remain unstable, the latching signal at the first voltage level is still outputted by the controller 102, and the voltage level of the controlling signal is locked.

In one embodiment, the predefined time duration can be adjusted.

In block S6, the latching signal at a second voltage level is received and the latching of the voltage level of the controlling signal is released.

In one embodiment, when the firmware is made effective and the predefined time duration has passed, the controller 102 outputs the latching signal at the second voltage level. The chip 101 releases the latching of the voltage level of the controlling signal based on the received latching signal at the second voltage level.

When the voltage level of the controlling signal is released, the chip 101 works normally based on the effected firmware.

The disclosed method of updating the firmware of the chip can latch or release the voltage level of the controlling signal outputted by the controlling pin 1011, and an updating operation of the chip 101 will not interrupt other operations being executed by the chip 101, and the chip 101 works stably.

Figure 3:
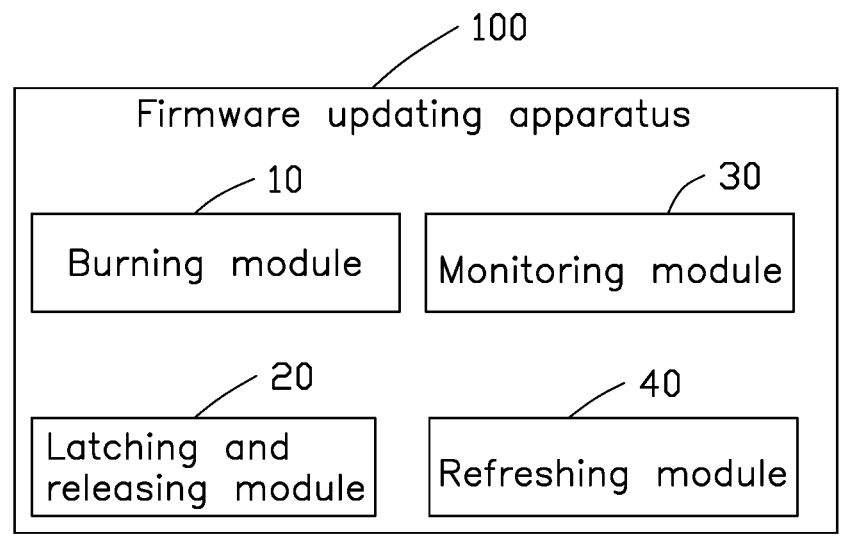
FIG. 3 is a diagram illustrating an embodiment of a software configuration of a firmware updating apparatus according to the present disclosure.

FIG. 3 shows a firmware updating apparatus 100.

Figure 4:
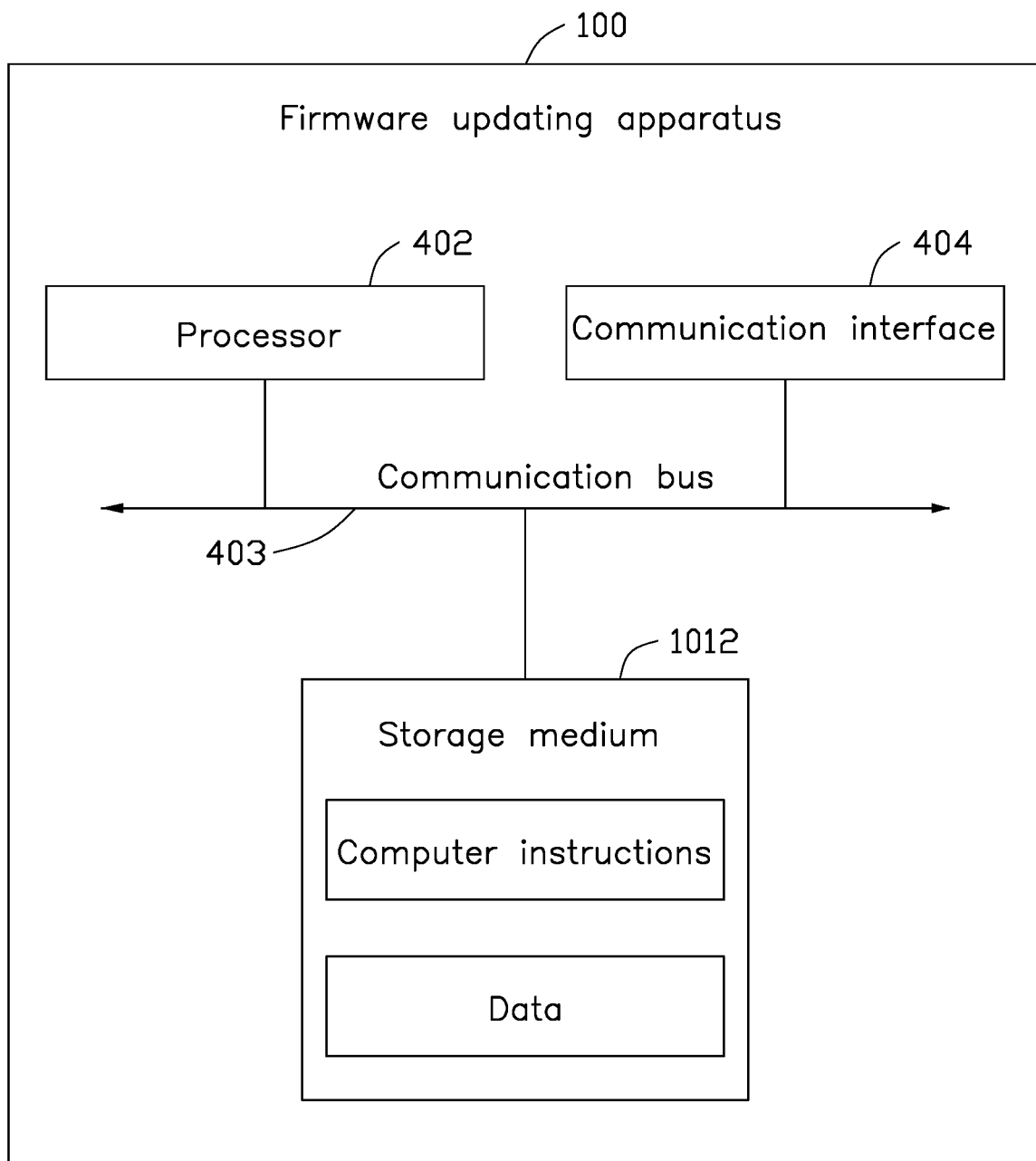
FIG. 4 is a diagram illustrating an embodiment of a hardware configuration of a chip according to the present disclosure.

In one embodiment, the firmware updating apparatus 100 includes one or more function modules composed by program codes. The program codes in the firmware updating apparatus 100 can be stored in a storage medium 1012 (as shown in FIG. 4), and be implemented by a processor (as shown in FIG. 4) for executing functions of the method shown in FIG. 2.

In one embodiment, the firmware updating apparatus 100 is divided into different modules based on different functionalities. The modules can include a burning module 10, a latching and releasing module 20, a monitoring module 30, and a refreshing module 40.

The burning module 10 receives the firmware, burns the received firmware into the chip 101 in background mode, and determines when the burning operation in background mode is completed.

In one embodiment, during the burning operation, the burning module 10 receives the latching signal at the second voltage level and the voltage level of the controlling pin 1011 becomes changeable according to the inputting signal received by the chip 101.

The latching and releasing module 20 receives the latching signal for locking the controlling signal outputted by the controlling pin 1011.

In one embodiment, the latching and releasing module 20 latches the voltage level of the controlling signal outputted by the controlling pin 1011 based on the latching signal at the first voltage level.

The refreshing module 40 receives a refresh instruction for making the burned firmware effective.

In one embodiment, the refresh instruction is generated by the controller 102, and the refreshing module 40 refreshes the storage medium 1012 to make the burned firmware effective.

The monitoring module 30 determines whether the operations of the chip 101 are stable.

In one embodiment, the monitoring module 30 receives the latching signal at the first voltage level in the predefined time duration for preventing jitter of the controlling signal. When the operations of the chip 101 are stable, the latching and releasing module 20 receives the latching signal at the second voltage level and releases the voltage level of the controlling signal outputted by the controlling pin 1011. When the operations of the chip 101 are unstable, the latching and releasing module 20 receives the latching signal at the first voltage level outputted by the controller and latches the voltage level of the controlling signal outputted by the controlling pin 1011.

In one embodiment, the predefined time duration can be adjusted.

The latching and releasing module 20 receives the latching signal at the second voltage level and releasing the latching of the controlling signal outputted by the controlling pin 1011.

In one embodiment, when the burned firmware has been made effective, and the predefined time duration has passed, the controller 102 can output the latching signal at the second voltage level, and the latching and releasing module 20 releases the voltage level of the controlling signal outputted by the controlling pin 1011 based on the latching signal at the second voltage level.

When the voltage level of the controlling signal outputted by the controlling pin 1011 is released, the chip 101 works normally based on the refreshed firmware.

FIG. 4 shows a hardware configuration of the firmware updating apparatus 100. In one embodiment, the firmware updating apparatus 100 includes a storage medium 1012, at least one processor 402, at least one communication bus 403, and a communication interface 404.

A person skilled in the art may understand that the structure of the firmware updating apparatus 100 shown in the FIG. 4 constitutes no limitation to the present disclosure, and may be a bus type structure or may be a star type structure, and may include more or fewer components than those shown in the figure, or some components may be combined, or a different component deployment may be used.

In some embodiments, the firmware updating apparatus 100 is an electronic device operating automatically according to a pre-set or pre-stored instruction, and its hardware includes, but is not limited to, a microprocessor, an application-specific integrated circuit (ASIC), a programmable gate array (FPGA), a digital processor (DSP), or an embedded device, etc. The firmware updating apparatus 100 also includes a client device. The client device can include, but is not limited to, any kind of electronic product that may perform human-machine interaction with a user through a keyboard, a mouse, a remote controller, a touch pad, or a handwriting device, and the like, for example a personal computer, a tablet, a mobile phone, a digital camera, and the like.

Those skilled in the art should understand that the above firmware updating apparatus 100 is only exemplary, and other existing or future electronic products, suitable for the instant process, should also be included within the protection scope and are incorporated here by reference.

In some embodiments, the storage medium 1012 is configured to store program codes and various data. The storage medium 1012 realizes high speed and automatic access of the program or data during operations on the firmware updating apparatus 100. The storage medium 1012 can include a read-only memory (ROM), a programmable read-only memory (PROM), an erasable programmable read-only memory (EPROM), an on-time programmable read-only memory (OTPROM), an electrically-erasable programmable read-only memory (EEPROM), a compact disc read-only memory (CD-ROM), an optical storage medium, a disk storage medium, a magnetic tape memory, or other mediums capable of carrying or storing computer readable data.

In some embodiments, the at least one processor 402 can be an integrated circuit, such as a single packaged integrated circuit, or may include a plurality of packaged integrated circuits having the same function or different functions. For example, the at least one processor 402 may include one or more central processing units (CPUs), microprocessors, digital signal processors (DSPs), graphic processing units (GPUs), or a combination thereof. The at least one processor 402 is a control unit of the firmware updating apparatus 100, connecting all parts of the firmware updating apparatus 100 by using all types of interfaces and circuits, and executes functions of the firmware updating apparatus 100 and processes data by running or executing the software program and/or modules stored in the storage medium 1012 and calling up data stored in the storage medium 1012.

In some embodiments, the at least one communication bus 403 enables communication between the storage medium 401 and the at least one processor 402.

In some embodiments, the communication interface 404 uses any apparatus like a transceiver, and is configured to communicate with another device or a communications network, such as an Ethernet, a radio access network (RAN), or a wireless local area network (WLAN), and the like.

The firmware updating apparatus 100 may further include a power supply (for example, a battery) for supplying power for all the components. Preferably, the power supply may be logically connected to the at least one processor 402 using a power supply management system such that functions such as charging and discharging management and power consumption management are implemented using the power supply management system. The power supply also can include one or more of a DC or AC power source, a recharging device, a power failure detection circuit, a power converter or inverter, a power status indicator, and the like. The firmware updating apparatus 100 may further include various devices, such as a WI-FI module, sensors, and the like.

It should be noted that the above embodiments are only for explaining the technical solutions of the present disclosure, and the above embodiments are not intended to be limiting.

The above described integrated modules implemented in a form of software function modules can be stored in a computer readable storage medium. The software function modules as described above are stored in a storage medium, and the software function modules include instructions for a computer device (e.g., the computer device can be a personal computer, a server, or a network device, etc.) or a processor to perform some or all steps of methods in various embodiments of the present disclosure.

The at least one processor 402 can execute various types of applications installed in the firmware updating apparatus 100, program codes, and the like. For example, the at least one processor 402 can execute all of the above modules.

The storage medium 1012 stores program codes, and the at least one processor 402 can invoke the program codes stored in the storage medium 1012 to perform functions. For example, the modules in FIG. 3 are program codes stored in the storage medium 1012, and executed by the at least one processor 402 to implement the functions of the various modules.

In one embodiment, the storage medium 1012 stores one or more instructions. The instructions can be executed by the at least one processor 402 to achieve the required purposes.

The at least one processor 402 implements an embodiment of a method of the instructions. Reference can be made to the description of relevant steps in the corresponding embodiments. The descriptions are not repeated herein.

In some embodiments provided by the present disclosure, it should be understood that the firmware updating apparatus and method as disclosed can be implemented in other manners. For example, the firmware updating apparatus embodiment described above is illustrative. For example, a division of the modules is only a logical function division, and an actual implementation can be in another manner of division.

The computer readable storage medium can be a transitory medium, and also can be a non-transitory medium.

The computer readable storage medium can include an area for storing programs and an area for data storage, wherein the area for storing programs may store an operating system and at least one desired application program; the area for data storage may store data created according to the use of the firmware updating apparatus 100, etc.

The modules that are described as separate components can be physically separated or not physically separated, and the components displayed as modules can be physically independent modules or otherwise. That is, the modules or components can be located at one place or scattered in several network units. A part or all of the modules may be selected according to actual needs to achieve the objectives of the solutions of the embodiments.

In addition, function modules in the embodiments of the present invention may be integrated into a processing module, or each of the modules may exist alone, or two or more modules can be integrated into one module. The integrated module can be implemented in a form of hardware, or can be implemented in a form of a software functional module.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of updating firmware of a chip used in a firmware updating apparatus; the firmware updating apparatus comprises a storage medium with program codes and a processor; the processor executes program codes in the storage medium to implement the following steps:
   receiving firmware outputted by a controller and burning the received firmware into the storage medium of the chip;
   receiving a latching signal at a first voltage level outputted by the controller and latching a voltage level of a controlling signal outputted by a controlling pin of the chip;
   receiving a refresh instruction outputted by the controller and refreshing the storage medium of the chip for effecting the burned firmware;
   determining whether operations of the chip are stable in a predefined time duration; and
   receiving the latching signal at a second voltage level and releasing the latching of the voltage level of the controlling signal outputted by the controlling pin if it is deemed that the operations of the chip are stable.

2. The method of claim 1, wherein the firmware was burned in a background mode.

3. The method of claim 1, wherein before the step of receiving the latching signal at the first voltage level, the method further comprises:
   determining whether the burning operation is completed.

4. The method of claim 3, wherein the method further comprises:
   receiving the latching signal at the second voltage level if it is deemed that the burning operation still executes.

5. The method of claim 1, wherein the method further comprises:
   receiving the latching signal at the first voltage level if it is deemed that the operations of the chip are unstable.

6. The method of claim 1, wherein the controller determines the voltage level of the controlling signal outputted by the controlling pin through a boundary scan manner.

7. The method of claim 1, wherein the refreshing operation is executed with other operations in parallel without being powered off or re-started the chip.

8. A firmware updating apparatus comprises:
   a storage medium with program codes; and
   a processor; the processor executes program codes in the storage medium to implement the following steps:
   receiving firmware outputted by a controller and burning the received firmware into the storage medium of the chip;
   receiving a latching signal at a first voltage level outputted by the controller and latching a voltage level of a controlling signal outputted by a controlling pin of the chip;
   receiving a refresh instruction outputted by the controller and refreshing the storage medium of the chip for effecting the burned firmware;
   determining whether operations of the chip are stable in a predefined time duration; and
   receiving the latching signal at a second voltage level and releasing the latching of the voltage level of the controlling signal outputted by the controlling pin if it is deemed that the operations of the chip are stable.

9. The firmware updating apparatus of claim 8, wherein the firmware was burned in a background mode.

10. The firmware updating apparatus of claim 8, wherein the processor further:
   determining whether the burning operation is completed.

11. The firmware updating apparatus of claim 10, wherein the processor further:
   receiving the latching signal at the second voltage level if it is deemed that the burning operation still executes.

12. The firmware updating apparatus of claim 8, wherein the processor further:
   receiving the latching signal at the first voltage level if it is deemed that the operations of the chip are unstable.

13. The firmware updating apparatus of claim 8, wherein the controller determines the voltage level of the controlling signal outputted by the controlling pin through a boundary scan manner.

14. The firmware updating apparatus of claim 8, wherein the refreshing operation is executed with other operations in parallel without being powered off or re-started the chip.

15. A non-transitory computer readable storage medium stores computer programs; the computer programs are executed by at least one processor to implement the following steps:
   receiving firmware outputted by a controller and burning the received firmware into the storage medium of the chip;
   receiving a latching signal at a first voltage level outputted by the controller and latching a voltage level of a controlling signal outputted by a controlling pin of the chip;
   receiving a refresh instruction outputted by the controller and refreshing the storage medium of the chip for effecting the burned firmware;
   determining whether operations of the chip are stable in a predefined time duration; and
   receiving the latching signal at a second voltage level and releasing the latching of the voltage level of the controlling signal outputted by the controlling pin if it is deemed that the operations of the chip are stable.

16. The non-transitory computer readable storage medium of claim 15, wherein before the step of receiving the latching signal at the first voltage level, the method further comprises:
   determining whether the burning operation is completed.

17. The non-transitory computer readable storage medium of claim 16, wherein the method further comprises:
   receiving the latching signal at the second voltage level if it is deemed that the burning operation still executes.

18. The non-transitory computer readable storage medium of claim 15, wherein the method further comprises:
   receiving the latching signal at the first voltage level if it is deemed that the operations of the chip are unstable.

19. The non-transitory computer readable storage medium of claim 15, wherein the firmware was burned in a background mode.

20. The non-transitory computer readable storage medium of claim 15, wherein the refresh operation is executed with other operations in parallel without being powered off or re-started the chip.

* * * * *